(12) United States Patent
Verma et al.

(10) Patent No.: US 7,049,201 B2
(45) Date of Patent: May 23, 2006

(54) METHOD AND APPARATUS FOR A HETEROJUNCTION BIPOLAR TRANSISTOR USING SELF-ALIGNED EPITAXY

(75) Inventors: Purakh Raj Verma, Singapore (SG); Shao-Fu Sanford Chu, Singapore (SG); Lap Chan, Singapore (SG); Jian Xun Li, Singapore (SG); Jia Zhen Zheng, Singapore (SG)

(73) Assignee: Chartered Semionductor Manufacturing Ltd., Singapore (SG)

( * ) Notice: Subject to any disclaimer, the term of this patent is extended or adjusted under 35 U.S.C. 154(b) by 174 days.

(21) Appl. No.: 10/703,297

(22) Filed: Nov. 6, 2003

(65) Prior Publication Data
US 2005/0101038 A1    May 12, 2005

(51) Int. Cl.
*H01L 21/331* (2006.01)

(52) U.S. Cl. ............... 438/312; 438/320; 438/235; 257/197; 257/565

(58) Field of Classification Search ........... 438/312, 438/320, 321, 317, 235; 257/565, 571, 197, 257/198
See application file for complete search history.

(56) References Cited

U.S. PATENT DOCUMENTS 6,660,607 B1 * 12/2003 Jagannathan .......... 438/309
6,867,105 B1 *  3/2005 Stengl et al. .......... 438/320

\* cited by examiner

*Primary Examiner*—Kevin M. Picardat
(74) *Attorney, Agent, or Firm*—Mikio Ishimaru (57) ABSTRACT

A heterojunction bipolar transistor (HBT), and manufacturing method therefor, comprising a semiconductor substrate having a collector region, a number of insulating layers over the semiconductor substrate, at least one of the number of insulating layers having a base cavity over the collector region, a base structure of a compound semiconductive material in the base cavity, a window in the insulating layer over the base cavity, an emitter structure in the window, an interlevel dielectric layer, and connections through the interlevel dielectric layer to the base structure, the emitter structure, and the collector region. The base structure and the emitter structure preferably are formed in the same processing chamber.

18 Claims, 6 Drawing Sheets

METHOD AND APPARATUS FOR A HETEROJUNCTION BIPOLAR TRANSISTOR USING SELF-ALIGNED EPITAXY

TECHNICAL FIELD

The present invention relates generally to semiconductor technology, and more particularly to heterojunction bipolar transistors (HBTS) and methods of manufacturing HBTs.

BACKGROUND ART

Demand for heterojunction bipolar transistors HBTs has increased significantly because these transistors are capable of operating at higher speeds and driving more current. These characteristics are important for high-speed, high-frequency communication networks such as those required by cell phones and computers.

HBTs can be used to provide linear voltage and current amplification because small variations of the voltage between the base and emitter terminals, and hence the base current, result in large variations of the current and voltage output at the collector terminal. The transistor also can be used as a switch in digital logic and power switching applications. Such HBTs find application in analog and digital circuits and integrated circuits at all frequencies from audio to radio frequency. Recent advancements in manufacturing transistors with compound semiconductive materials have created a renewed interest in the use of HBTs.

A bipolar junction transistor (BJT) is a three-terminal device that can controllably vary the magnitude of the electrical current that flows between two of the terminals. The three terminals include a base terminal, a collector terminal, and an emitter terminal. The movement of electrical charge carriers produce electrical current flow between the collector and the emitter terminals varies dependent upon variations in the voltage on the base terminal thereby causing the magnitude of the current to vary. Thus, the voltage across the base and emitter terminals controls the current flow through the emitter and collector terminals.

The terminals of a BJT are connected to their respective base, collector and emitter structures formed in a semiconductor substrate. BJTs comprise two p-n junctions placed back-to-back in close proximity to each other, with one of the regions common to both junctions. There is a first junction between the base and the emitter, and a second junction between the emitter and the collector. This forms either a p-n-p or an n-p-n transistor depending upon the characteristics of the semiconductive materials used to form the HBT.

HBTs are BJTs where the emitter-base junction is formed from two different semiconductive materials having similar characteristics. One material used in forming the base-emitter junction preferably is a compound semiconductive material such as silicon and silicon-germanium (SiGe), or silicon-germanium-carbon (SiGeC), or a combination thereof. HBTs using compound semiconductive materials have risen in popularity due to their high-speed and low electrical noise capabilities, coupled with the ability to manufacture them using processing capabilities used in the manufacture of silicon BJTs. HBTs have found use in higher-frequency applications such as cell phones, optical fiber, and other high-frequency applications requiring faster switching transistors, such as satellite communication devices.

Although the use of compound semiconductive materials has proven useful in HBTs, once formed by existing methods, this material is subsequently subjected to multiple thermal cycles, implantations and/or etching processes during the formation steps of the remaining elements of the HBT. Such steps include the deposition and etching of oxide layers, nitride layers and subsequently formed polysilicon layers. Several of these processing steps inherently damage the compound semiconductive material. Etching polysilicon over a compound semiconductive layer, for example, adversely affects the compound semiconductive material because the etchants used do not selectively etch only the polysilicon. Some of the compound semiconductive material is also etched during this processing step, resulting in HBTs that are relatively slower and exhibit relatively poor noise performance compared to other HBTs on the same semiconductor wafer.

Furthermore, to improve the operating speed of a HBT, it is important that the base structure be thin enough to minimize the time it takes electronic charges to move from the emitter to the collector, thereby minimizing the response time of the HBT. It is also important, however, that the base structure have a high concentration of dopant in order to minimize base resistance. Typically, ion implantation techniques are used to form a base layer. However, this technique has the problem of ion channeling, which limits the minimum thickness of the base layer. Another disadvantage of ion implantation is that the compound semiconductive layer is often damaged by the ions during implantation.

Additionally, high-temperature annealing typically is required to drive dopants into the various material layers. This annealing step, however, alters the profile of concentration levels of the dopants within the various layers of semiconductive materials forming the transistor to create undesirable dopant profiles within the various material layers.

Existing methods of manufacturing HBTs still have the problems associated with over-etching, the detrimental effects of ion implantation and annealing, and consistency of manufacturability. Additionally, the processing methods used tend to require relatively long manufacturing cycle times and are expensive due to the requirement of two epitaxy deposition steps.

Solutions to these problems have been long sought but prior developments have not taught or suggested any solutions and, thus, solutions to these problems have long eluded those skilled in the art.

DISCLOSURE OF THE INVENTION

The present invention provides a heterojunction bipolar transistor (HBT), and manufacturing method therefor. The HBT comprises a semiconductor substrate having a collector region, a plurality of insulating layers over the semiconductor substrate, at least one of the plurality of insulating layers having an undercut region over the collector region, a base structure of a compound semiconductive material in the undercut region, a window in the insulating layer over the undercut region, an emitter structure in the window, an interlevel dielectric layer, and connections through the interlevel dielectric layer to the base structure, the emitter structure, and the collector region. The base structure and the emitter structure preferably are formed in the same processing chamber.

The HBT of the present invention overcomes the problems associated with over-etching, the detrimental effects of ion implantation and annealing, and inconsistency of manufacturability experienced in existing methods of manufacture of HBTs. In addition, the present invention results in a HBT having lower collector to substrate load capacitance, lower base resistance and can be manufactured using only one epitaxy growth step.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known semiconductor configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the FIGS. Generally, the device can be operated in any orientation.

The term "horizontal" as used herein is defined as a plane parallel to the conventional plane or surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "beside" refers to two structures, which are side by side with neither overlapping the other.

The term "processing" as used herein includes deposition of material or photoresist, patterning, exposure, development, etching, cleaning, and/or removal of the material or photoresist as required in forming a described structure.

The term "conductivity type" as used herein refers to a semiconductive material that uses either electrons as the primary carrier of electrical charge, on one hand, or holes as the primary carrier of electrical charge, on the other hand.

Figure 1:
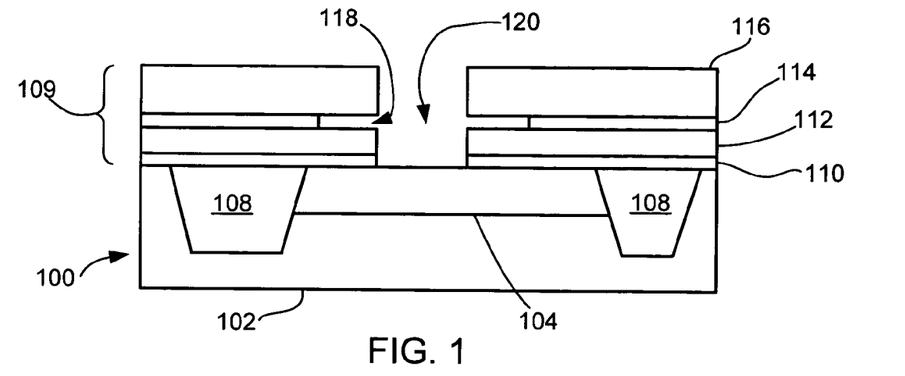
FIG. 1 is a partial cross sectional view of a HBT in an intermediate stage of manufacture in accordance with the present invention.

Referring now to FIG. 1, therein is shown a partial cross-sectional view of a heterojunction bipolar transistor (HBT) 100 in an intermediate stage of manufacture in accordance with the present invention. The HBT 100 includes a semiconductor substrate 102 having a collector region 104.

The semiconductor substrate 102 also has a number of shallow trench isolations (STIs) 108. The number of STIs 108 are formed, for example, by etching trenches in the semiconductor substrate 102, and then forming an insulating layer, such as an oxide layer, into the trenches to form the number of STIs 108.

The semiconductor substrate 102 is a lightly doped semiconductive material of a first conductivity type, such as a p doped silicon. The collector region 104 is a heavily doped semiconductive material of a second conductivity type, such as an $n^+$ doped silicon.

Above the collector region 104 and the number of STIs 108 is formed a number of insulating layers 109. In the embodiment shown in FIG. 1, the number of insulating layers 109 comprises a first insulating layer 110, a second insulating layer 112, a third insulating layer 114, and a fourth insulating layer 116.

The first insulating layer 110, such as an oxide layer, is formed over the collector region 104. Preferably, the first insulating layer 110 comprises a thin oxide layer between about 50 angstroms and about 150 angstroms in thickness.

The first insulating layer 110 is covered by the second insulating layer 112, such as a nitride layer. Preferably, the second insulating layer 112 comprises a thick nitride layer between about 3000 angstroms and about 5000 angstroms in thickness.

The third insulating layer 114 is formed over the second insulating layer 112, such as a thin oxide layer. Preferably, the third insulating layer 114 comprises a thin TEOS layer between about 300 angstroms and about 700 angstroms thick.

The fourth insulating layer 116, such as a thick nitride layer, is formed over the third insulating layer 114.

The fourth insulating layer is etched preferably using an anisotropic dry etch process. The third insulating layer 114 is etched using an isotropic etch process to form a base cavity 118 in the third insulating layer 114. For example, if the third insulating layer is an oxide layer, a HF wet etch process can be used to form the base cavity 118.

The second insulating layer 112 and the first insulating layer 110 are each etched using an anisotropic etch process to expose a portion of the collector region 104. There is thus formed a window 120 in the first insulating layer 110, the second insulating layer 112, the third insulating layer 114, and the fourth insulating layer 116 over a portion of the collector region 104 of the semiconductor substrate 102.

Figure 2:
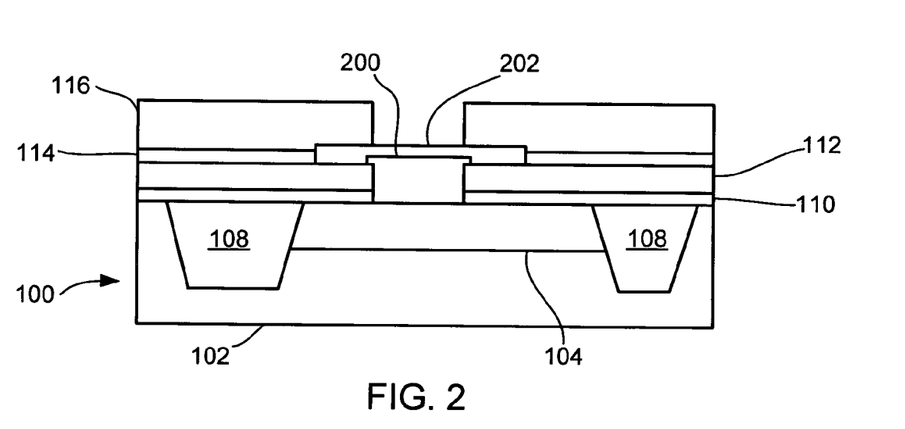
FIG. 2 is the structure of FIG. 1 after formation of a collector structure and a base structure.

Referring now to FIG. 2, therein is shown the structure of FIG. 1 after formation of a collector structure 200 and a base structure 202.

The collector structure 200 preferably is selectively grown epitaxial silicon, such as lightly doped epitaxial silicon of the second conductivity type, for example, an n⁻ doped epitaxial silicon, over the exposed portion of the collector region 104 in the semiconductor substrate 102. The collector structure 200 is grown to a height that preferably extends slightly above the level of the second insulating layer 112, for example between about 50 angstroms to about 500 angstroms higher than the level of the second insulating layer 112.

The base structure 202 is grown over the collector structure 200 and into the base cavity 118 in the third insulating layer 114. The base structure is formed of a compound semiconductive material, such as at least one of silicon-germaniumr (SiGe), silicon-germanium-carbon (SiGeC), and combinations thereof.

Preferably, the collector structure 200 and the base structure 202 are grown in a single processing step. The collector structure 200 is selectively grown over the exposed portion of the collector region 104 in the window 120. The collector structure 200 can be grown in a suitable chamber used for epitaxy processes in an atmosphere of $SiH_2Cl_2+PH_3$, for example, to the desired thickness. Then without removing the semiconductor substrate 102 from the epitaxial processing chamber, the atmosphere used to grow the collector structure is evacuated from the processing chamber. After evacuation, the atmosphere is changed to $SiH_2Cl_2+GeH_4+B_2H_6$ to form the base structure 202. The collector structure 200 and the base structure 202 are thus formed in a single processing step of epitaxially growing these structures in a single processing chamber.

Figure 3:
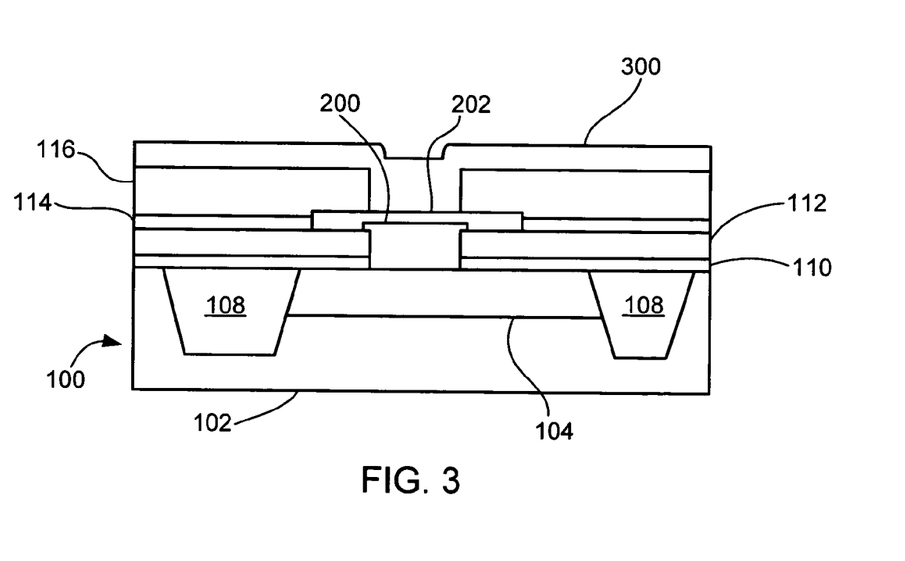
FIG. 3 is the structure of FIG. 2 after formation of a polysilicon layer.

Referring now to FIG. 3, therein is shown the structure of FIG. 2 after formation of a polysilicon layer 300 such as a heavily doped semiconductive material of the second conductivity type, for example, an n⁺ polysilicon layer. The polysilicon layer 300 can be doped appropriately, for example with arsenic or phosphorous, during formation of the polysilicon layer 300 to avoid ion implantation or subsequent annealing steps.

Figure 4:
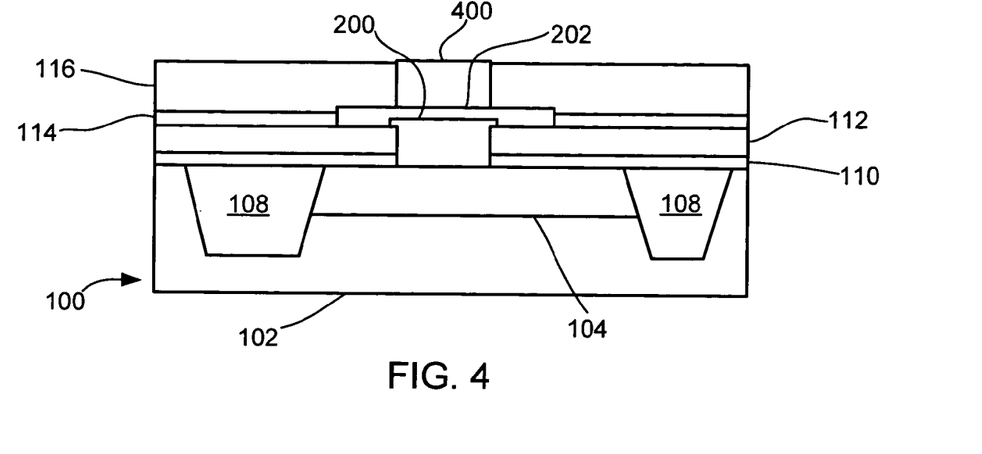
FIG. 4 is the structure of FIG. 3 after formation of an emitter structure.

Referring now to FIG. 4, therein is shown the structure of FIG. 3 after formation of an emitter structure 400. The emitter structure 400 is formed by etching the polysilicon layer 300 to the level of the fourth insulating layer 116, or performing a chemical mechanical polishing (CMP) step on the polysilicon layer 300. Alternatively, the emitter structure 400 can be selectively grown over the base structure using heavily doped silicon of the second conductivity type, such as an n⁺ doped silicon, or appropriately doped polysilicon.

Figure 5:
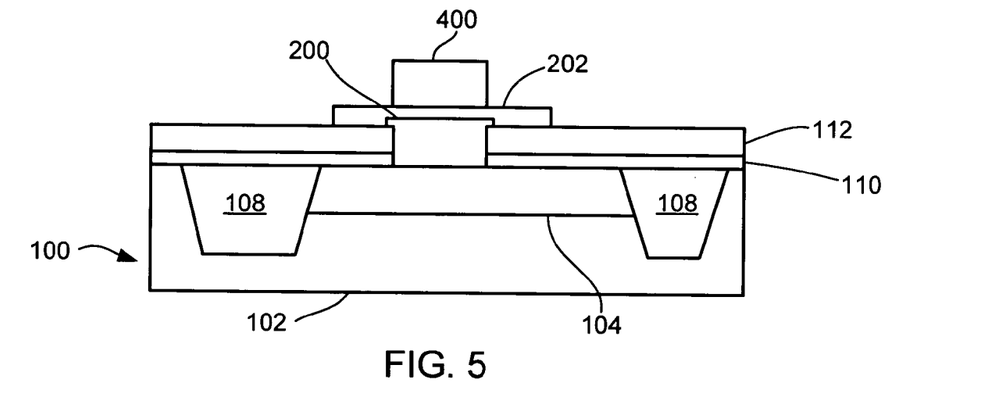
FIG. 5 is the structure of FIG. 4 after removal of a third insulating layer and a fourth insulating layer.

Referring now to FIG. 5, therein is shown the structure of FIG. 4 after removal of the fourth insulating layer 116 and the third insulating layer 114. The fourth insulating layer 116 and the third insulating layer 114 are removed, for example, by etching, or by other suitable stripping processes.

Figure 6:
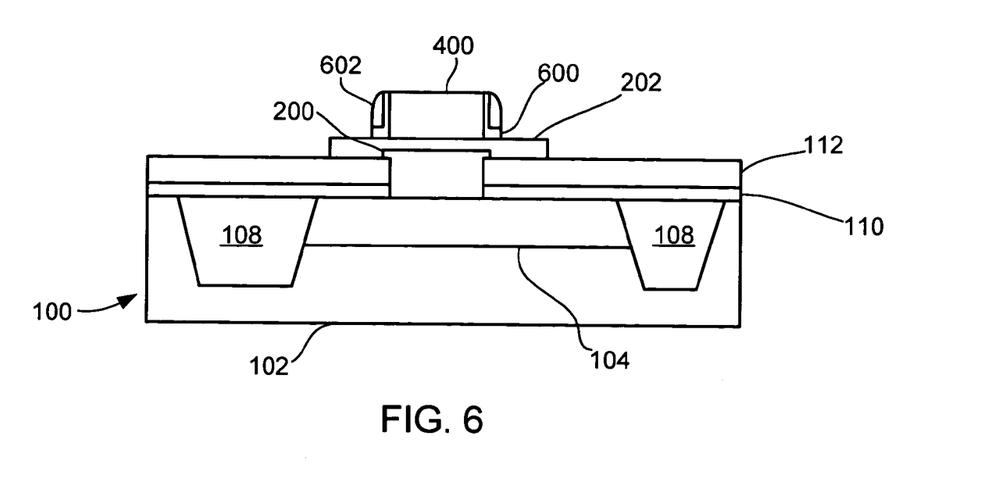
FIG. 6 is the structure of FIG. 5 after formation of insulating spacers around the emitter structure.

Referring now to FIG. 6, therein is shown the structure of FIG. 5 after formation of a first insulating spacer 600 and a second insulating spacer 602 around the emitter structure 400. The first insulating spacer 600 is formed, for example, by depositing a first insulating material, such as an oxide, and processing it to form the first insulating spacer 600. The second insulating spacer 602 is formed by depositing a second insulating material, such as a nitride, and processing it to form the second insulating spacer 602. The third insulating layer 114 is then removed, such as by etching to stop on the second insulating layer 112.

Figure 7:
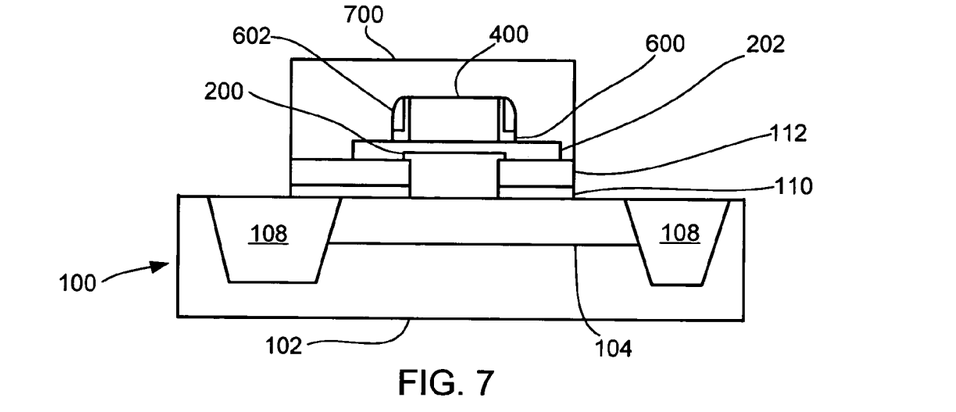
FIG. 7 is the structure of FIG. 6 after processing of a first insulating layer and a second insulating layer.

Referring now to FIG. 7, therein is shown the structure of FIG. 6 after processing of the second insulating layer 112 and the first insulating layer 110. The structure of FIG. 6 is masked using a photoresist layer 700. The photoresist layer 700 is patterned and processed to remove a portion of the second insulating layer 112 and a portion of the first insulating layer 110. It should be noted that this masking and processing step could be used to provide a salicide block mask (not shown) elsewhere on the semiconductor substrate 102, if necessary.

Figure 8:
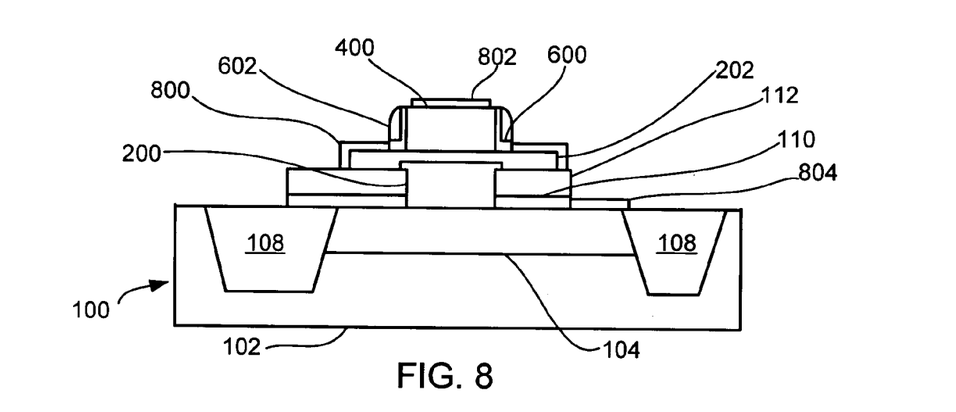
FIG. 8 is the structure of FIG. 7 after salicidation.

Referring now to FIG. 8, therein is shown the structure of FIG. 7 after salicidation. The photoresist layer 700 shown in FIG. 7 is removed using readily available semiconductor processing techniques. A salicide process is carried out to cover the areas for the various contacts. The exposed portion of the base structure 202 is covered by a first salicide layer 800. The emitter structure 400 is covered by a second salicide layer 802, and a portion of the collector region 104 is covered by a third salicide layer 804.

Figure 9:
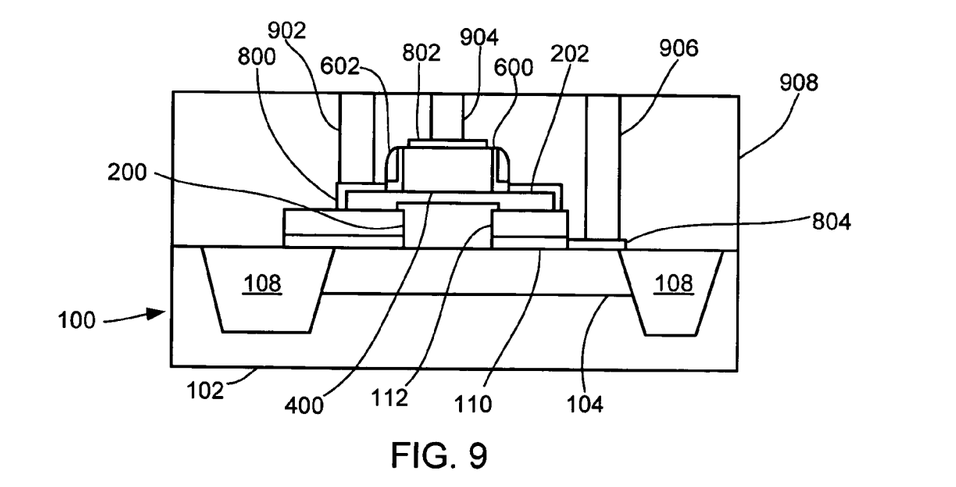
FIG. 9 is the structure of FIG. 8 after formation of the base, emitter and collector contacts in an interlevel dielectric layer.

Referring now to FIG. 9, therein is shown the structure of FIG. 8 after formation of a base contact 902, an emitter contact 904 and a collector contact 906 in an interlevel dielectric (ILD) layer 908. The ILD layer 908 is formed for example, by depositing an insulating material, such as oxide, and then performing a CMP process to planarize the upper surface of the ILD layer 908. The ILD layer 908 is then processed to form trenches that are filled with a conductive material, such as tungsten (W), to provide the various contacts of the HBT 100.

The base contact 902 is formed by filling a trench through the ILD layer 908 that connects to the first salicide layer 800 over the base structure 202. The emitter contact 904 is formed by filling a trench through the ILD layer 908 that connects to the second salicide layer 802 over the emitter structure 400. The collector contact 906 is formed by filling a trench through the ILD layer 908 that connects to the third salicide layer 804 over the collector region 104.

Figure 10:
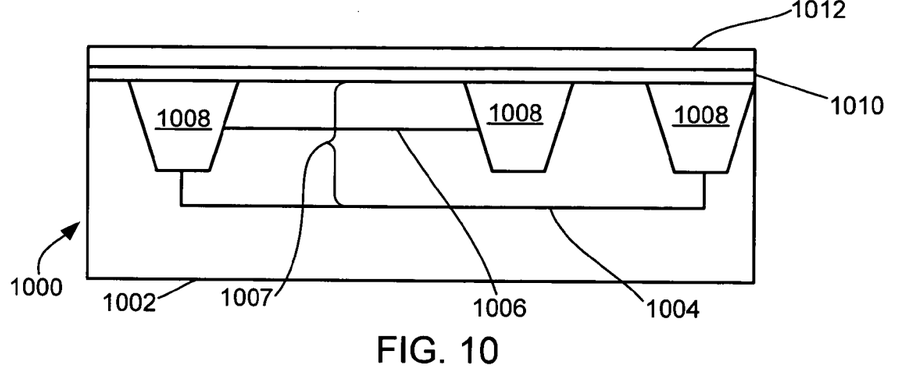
FIG. 10 is a partial cross sectional view, of an HBT in an intermediate stage of manufacture in accordance with another embodiment of the present invention.

Referring now to FIG. 10, therein is shown a partial cross sectional view of an HBT 1000 in an intermediate stage of manufacture in accordance with another embodiment of the present invention. The HBT 1000 includes a semiconductor substrate 1002, such as a silicon substrate of a first conductivity type, for example a p⁻ doped silicon substrate. The semiconductor substrate 1002 has a buried collector region 1004, such as a heavily doped region of a second conductivity type, for example, an n⁺ doped region and a sub-collector region 1006, such as a lightly doped region of the second conductivity type, for example, an n⁻ doped region. Together the buried collector region 1004 and the sub-collector region 1006 are referred to herein as a collector region 1007.

The semiconductor substrate 1002 also has a number of shallow trench isolations (STIs) 1008. The number of STIs 1008 is formed, for example, by etching trenches in the semiconductor substrate 1002, and then forming an insulating layer, such as an oxide layer, into the trenches to form the number of STIs 1008.

Above the collector region 1007 and the number of STIs 1008 is formed a number of insulating layers 1009. In the embodiment shown in FIG. 10, the number of insulating layers 1009 comprises a first insulating layer 1010, and a second insulating layer 1012.

The first insulating layer 1010, such as an oxide layer, is formed over the collector region 1007 of the semiconductor substrate 1002. A second insulating layer 1012, such as a nitride layer, is formed over the first insulating layer 1010.

Figure 11:
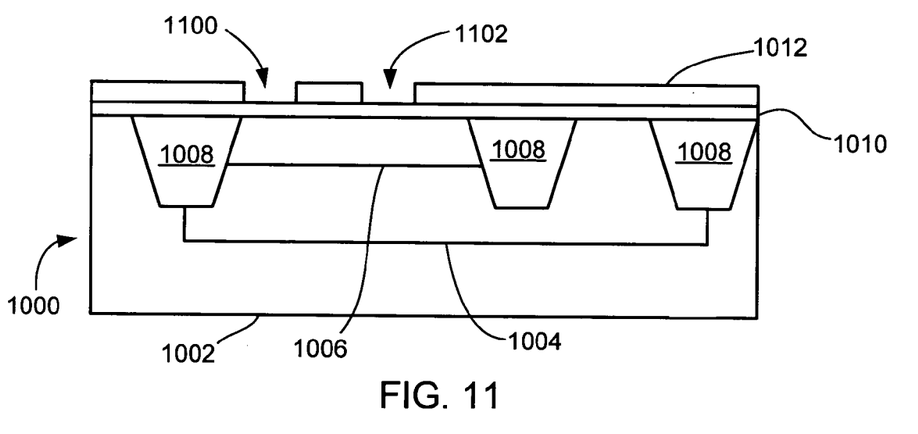
FIG. 11 is the structure of FIG. 10 after formation of a base window and an emitter window.

Referring now to FIG. 11, therein is shown the structure of FIG. 10 after formation of a base window 1100 and an emitter window 1102 in the second insulating layer 1012. The base window 1100 and the emitter window 1102 are slots formed by processing the second insulating layer using readily available semiconductor processing techniques to mask and etch the second insulating layer 1012.

Figure 12:
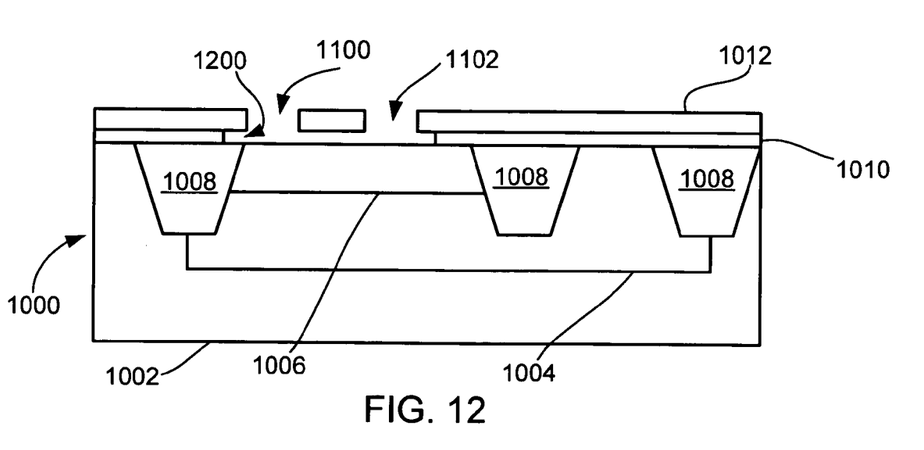
FIG. 12 is the structure of FIG. 11 after formation of a base cavity.

Referring now to FIG. 12, therein is shown the structure of FIG. 11 after formation of a base cavity 1200 in the first insulating layer 1010. The base cavity 1200 is formed by performing an anisotropic etch, such as a wet etch, of the first insulating layer 1010 in the base window 1100 and the emitter window 1102 that partially undercuts the second insulating layer 1012 laterally from the edges of the base window 1100 and the emitter window 1102.

Figure 13:
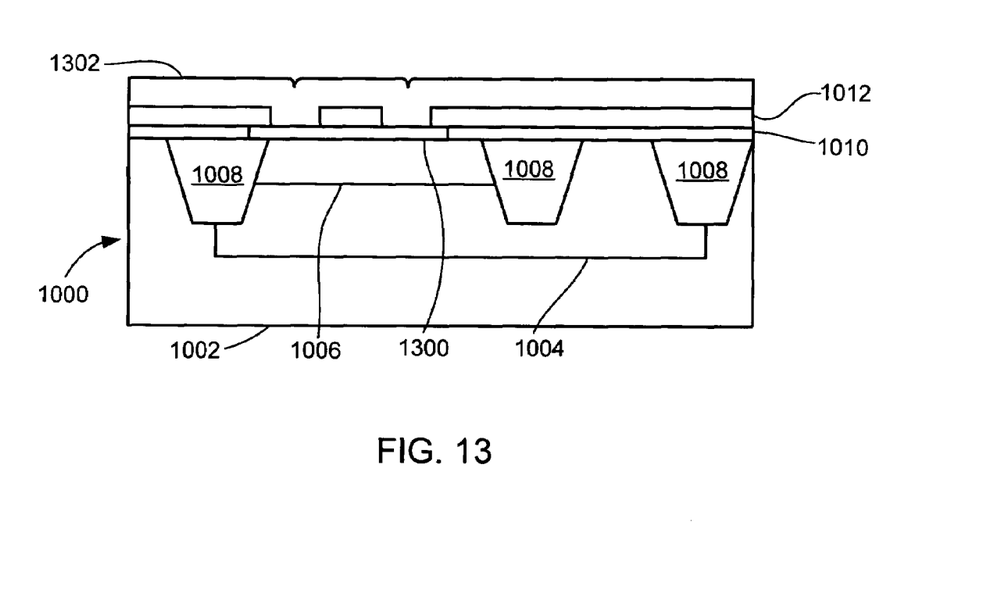
FIG. 13 is the structure of FIG. 12 after formation of a base structure.

Referring now to FIG. 13, therein is shown the structure of FIG. 12 after formation of a base structure 1300 in the base cavity 1200. The base structure 1300 is formed by selectively growing an epitaxial material in the base cavity 1200 shown in FIG. 12. The base structure 1300 is grown over the collector region 1007 and into the base cavity 1200. The base structure 1300 is formed of a compound semiconductive material, such as at least one of silicon-germanium (SiGe), silicon-germanium-carbon (SiGeC), and combinations thereof. The base structure 1300 is lightly doped to provide a lightly doped compound semiconductive material of the first type, such as a p doped compound semiconductive material. A polysilicon layer 1302 then is formed over the second insulating layer 1012 and the base structure 1300.

Figure 14:
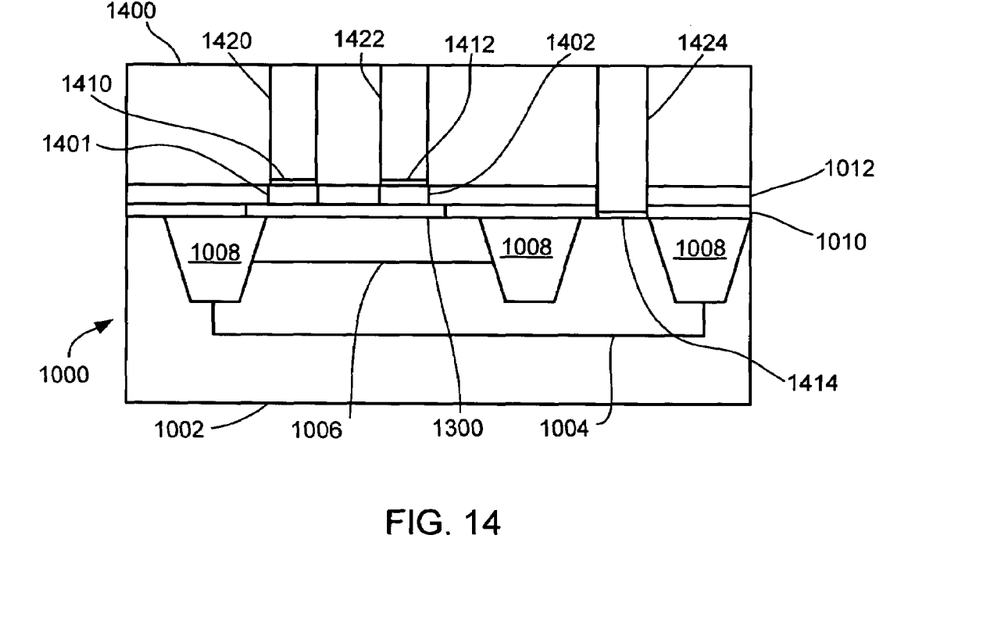
FIG. 14 is the structure of FIG. 13 after formation of a plurality of contacts in an interlevel dielectric layer.

Referring now to FIG. 14, therein is shown the structure of FIG. 13 after formation of a number of contacts in an interlevel dielectric (ILD) layer 1400. An extrinsic base structure 1401 and an emitter structure 1402 are formed by etching, or performing a chemical mechanical polishing (CMP) process on, the polysilicon layer 1302 shown in FIG. 13 to the level of the second insulating layer 1012. The upper surfaces of the extrinsic base structure 1401 and the emitter structure 1402 are substantially coplanar with the upper surface of the second insulating layer 1012.

The extrinsic base structure 1401 is patterned and processed to provide a heavily doped semiconductive structure of the first conductivity type, such as a $p^+$ doped polysilicon. The emitter structure 1402 is patterned and processed to provide a heavily doped semiconductive structure of the second conductivity type, such as an $n^+$ doped polysilicon. Alternatively, the extrinsic base structure 1401 and the emitter structure 1402 can be selectively grown over the base structure 1300 using appropriately doped epitaxial silicon or appropriately doped polysilicon.

As discussed above with respect to the previous embodiment of the present invention, preferably, the base structure 1300, the extrinsic base structure 1401 and the emitter structure 1402 are formed in a single processing step. The extrinsic base structure 1401 and the emitter structure are selectively grown over the exposed portion of the base structure 1300. For example, the base structure 1300 can be grown in a suitable processing chamber used for epitaxy processes in an atmosphere of $SiH_2Cl_2+GeH_4+B_2H_6$ to form the base structure 1300. Then, without removing the semiconductor substrate 1002 from the processing chamber, the atmosphere is changed to grow epitaxial polysilicon to form the extrinsic base structure 1401, and then changed again to form the emitter structure 1402. The atmosphere can be changed by evacuating the processing chamber of one gas and then introducing another gas to create the appropriate atmosphere for the continued growth. The base structure 1300, the extrinsic base structure 1401, and the emitter structure 1402 are thus formed in a single processing step of epitaxial growth.

A salicide process is carried out to cover the areas for the various contacts. The extrinsic base structure 1401 is covered by a first salicide layer 1410. The emitter structure 1402 is covered by a second salicide layer 1412, and a portion of the collector region 1007 is covered by a third salicide layer 1414.

The ILD layer 1400 is formed, for example, by depositing an insulating material, such as oxide, and then performing a CMP process to planarize the upper surface of the ILD layer 1400. The ILD layer 1400 is then processed to form trenches that are filled with a conductive material, such as tungsten (W), to provide the various contacts of the HBT 1000.

The base contact 1420 is formed by filling a trench through the ILD layer 1400 that connects to the first salicide layer 1410 over the extrinsic base structure 1401. The emitter contact 1422 is formed by filling a trench through the ILD layer 1400 that connects to the second salicide layer 1412 over the emitter structure 1402. The collector contact 1424 is formed by filling a trench through the ILD layer 1400 that connects to the third salicide layer 1414 over the collector region 1007.

Figure 15:
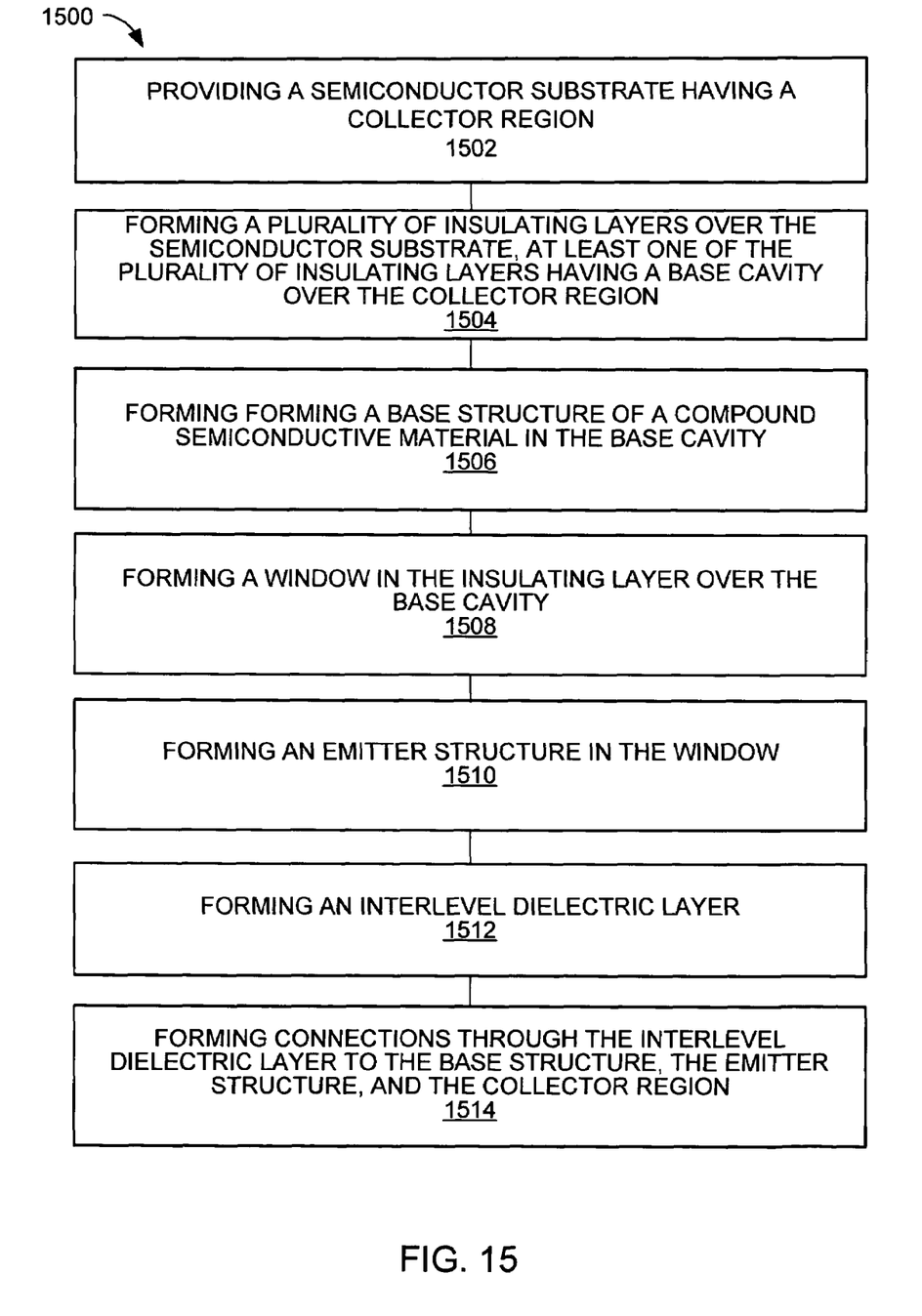
FIG. 15 is a flow chart of a method for manufacturing a heterojunction bipolar transistor in accordance with the present invention.

Referring now to FIG. 15, therein is shown a flow chart of a method 1500 for manufacturing a heterojunction bipolar transistor in accordance with the present invention. The method 1500 includes a step 1502 of providing a semiconductor substrate having a collector region; a step 1504 of forming a plurality of insulating layers over the semiconductor substrate, at least one of the plurality of insulating layers having a base cavity over the collector region; a step 1506 of forming a base structure of a compound semiconductive material in the base cavity; a step 1508 of forming a window in the insulating layer over the base cavity; a step 1510 of forming an emitter structure in the window; a step 1512 of forming an interlevel dielectric layer over the insulating layer; and a step 1514 of forming connections through the interlevel dielectric layer to the base structure, the emitter structure, and the collector region.

Thus, it has been discovered that the method and apparatus of the present invention furnish important and heretofore unavailable solutions, capabilities, and functional advantages for heterojunction bipolar transistors. The resulting process and configurations are straightforward, economical, uncomplicated, highly versatile and effective, use conventional technologies, and are thus readily suited for manufacturing heterojunction bipolar devices/fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A method of manufacturing a heterojunction bipolar transistor comprising:
   providing a semiconductor substrate having a collector region;
   forming a plurality of insulating layers over the semiconductor substrate, at least one layer of the plurality of insulating layers having a base cavity over the collector region;
   forming a collector structure over the collector region under the base cavity;
   forming a base structure of a compound semiconductive material in the base cavity;

forming a window in the plurality of insulating layers over the base cavity;

forming an emitter structure in the window;

forming an interlevel dielectric layer; and forming connections through the interlevel dielectric layer to the base structure, the emitter structure, and the collector region.

2. The method of manufacturing a heterojunction bipolar transistor as claimed in claim 1 wherein forming the base structure forms a structure comprising at least one of silicon-germanium, silicon-germanium-carbon, and combinations thereof.

3. The method of manufacturing a heterojunction bipolar transistor as claimed in claim 1 wherein forming the base structure, and forming the emitter structure forms a base structure and emitter structure in the same processing chamber.

4. The method of manufacturing a heterojunction bipolar transistor as claimed in claim 1 wherein the collector structure, the base structure, and the emitter structure are vertically aligned.

5. A method of manufacturing a heterojunction bipolar transistor comprising:

providing a semiconductor substrate having a collector region;

forming an of insulating layer having a base cavity therein over the collector region;

forming a base structure of a compound semiconductive material in the base cavity;

forming an emitter structure over a first portion of the base structure;

forming an extrinsic base structure over a second portion of the base structure;

forming an interlevel dielectric layer over the collector region, the base structure and the emitter structure; and forming connections through the interlevel dielectric layer to the base structure, the emitter structure, and the collector region.

6. The method of manufacturing a heterojunction bipolar transistor as claimed in claim 5 wherein forming the base structure and forming the emitter structure are formed in the same processing chamber.

7. The method of manufacturing a heterojunction bipolar transistor as claimed in claim 5 wherein forming the base structure forms a structure comprising at least one of silicon-germanium, silicon-germanium-carbon, and combinations thereof.

8. The method of manufacturing a heterojunction bipolar transistor as claimed in claim 5 further comprising;

forming a second insulating layer over the first insulating layer;

forming an extrinsic base structure in the second insulating layer;

and wherein forming an emitter structure forms an emitter structure in the second insulating layer.

9. A heterojunction bipolar transistor comprising:

a semiconductor substrate having a collector region;

a plurality of insulating layers over the semiconductor substrate, at least one of the plurality of insulating layers having a base cavity over the collector region;

a collector structure over the collector region under the base cavity;

a base structure of a compound semiconductive material in the base cavity;

a window in one of the plurality of insulating layer over the base cavity;

an emitter structure in the window;

an interlevel dielectric layer; and connections through the interlevel dielectric layer to the base structure, the emitter structure, and the collector region.

10. The heterojunction bipolar transistor as claimed in claim 9 wherein the base structure is a structure comprising at least one of silicon-germanium, silicon-germanium-carbon, and combinations thereof.

11. The heterojunction bipolar transistor as claimed in claim 9 wherein the base structure and the emitter structure have upper surfaces that are substantially coplanar.

12. The heterojunction bipolar transistor as claimed in claim 9 wherein the collector structure, the base structure, and the emitter structure are vertically aligned.

13. A heterojunction bipolar transistor comprising:

a semiconductor substrate having a collector region;

an insulating layer having a base cavity therein over the collector region;

a base structure of a compound semiconductive material in the base cavity;

an emitter structure over a first portion of the base structure;

an extrinsic base structure over a second portion of the base structure;

an interlevel dielectric layer over the collector region, the base structure and the emitter structure; and connections through the interlevel dielectric layer to the base structure, the emitter structure, and the collector region.

14. The heterojunction bipolar transistor as claimed in claim 13 wherein the emitter structure and the extrinsic base structure are formed in a second insulating layer.

15. The heterojunction bipolar transistor as claimed in claim 13 wherein the base structure and the emitter structure have upper surfaces that are substantially coplanar.

16. The heterojunction bipolar transistor claimed in claim 13 wherein the base structure comprises at least one of silicon-germanium, silicon-germanium-carbon and combinations thereof.

17. The method of manufacturing a heterojunction bipolar transistor as claimed in claim 1 wherein forming the collector structure, and forming the base structure comprises;

positioning the substrate in a processing chamber;

selectively growing the collector structure in a first atmosphere;

evacuating the first atmosphere from the processing chamber without removing the substrate from the processing chamber; and selectively growing the base structure in a second atmosphere in the processing chamber.

18. The method of manufacturing a heterojunction bipolar transistor as claimed in claim 5 wherein forming a base structure of a compound semiconductive material in the base cavity; forming an emitter structure over a first portion of the base structure; and forming extrinsic base structure over a second portion of the base structure, comprises:

positioning the substrate in a processing chamber;

selectively growing the base structure in a first atmosphere;

evacuating the first atmosphere from the processing chamber without removing the substrate from the processing chamber; and selectively growing the emitter structure and the extrinsic base structure in the processing chamber.

* * * * *